Oct. 25, 1960 A. BLAIN 2,958,014

INTERLOCKING SYSTEMS

Filed Feb. 12, 1957 2 Sheets-Sheet 1

INVENTOR

Albert Blain

BY Charles C. English

AGENT

Oct. 25, 1960 A. BLAIN 2,958,014

INTERLOCKING SYSTEMS

Filed Feb. 12, 1957 2 Sheets-Sheet 2

Code: \=0; /=1

INVENTOR

Albert Blain

BY Charles C. English

AGENT

United States Patent Office 2,958,014
Patented Oct. 25, 1960

2,958,014

INTERLOCKING SYSTEMS

Albert Blain, Philadelphia, Pa., assignor to Sperry Rand Corporation, New York, N.Y., a corporation of Delaware Filed Feb. 12, 1957, Ser. No. 639,825
26 Claims. (Cl. 317—101)

The present invention relates to electrical systems of the types employing circuit boards or cards; and is more particularly concerned with an improved mechanical and electrical arrangement, utilizing such circuit boards, which assures that a plurality of such boards or cards are located at proper positions relative to one another within an overall system.

Various circuit installations known at the present time utilize printed and other electrical circuits disposed upon circuit boards which may be readily installed and removed from racks provided for mounting purposes. The circuits themselves are often standardized in nature whereby a given circuit board may contain the electrical components and wiring required to perform a given predetermined logical or control function; and in general, a plurality of different circuit boards may be so arranged and electrically interconnected at predetermined locations within a mounting rack that a desired overall function may be accomplished by the resulting system. This consideration necessarily requires that particular circuit boards be mounted or otherwise disposed at particular predetermined relative locations, but in the past it has been possible to incorrectly place one or more circuit boards in the mounting rack whereby the system does not operate at all or incorrect operation is effected.

The present invention serves to obviate this difficulty, and relates to an improved interlock system which assures that incorrect assembly and interconnection of a circuit board arrangement cannot occur; and which particuarly assures that no power can be applied to a printed or other electrical circuit structure unless the several circuit boards thereof are correctly disposed relative to one another and for the mounting rack. In providing for this basic purpose, the structures and concepts of the present invention further assure that circuit boards cannot be removed from an overall system so long as power is applied thereto.

It is accordingly an object of the present invention to provide an improved printed circuit arrangement.

A further object of the present invention resides in the provision of an improved mechanical and electrical arrangement utilizing one or more circuit boards which assures that no power can be applied unless said circuit board or boards are correctly disposed within an overall circuit structure.

Still another object of the present invention resides in the provision of an interlocking system for use in printed and other circuit structures utilizing circuit cards or boards, which interlock assures that power and/or signals are applied to said circuit boards only when they are correctly located within the system, and which further assures that said circuit boards cannot be removed from the system until power is removed therefrom.

A still further object of the present invention resides in the provision of an improved interlocking system comprising a plurality of key structures of such configuration that the keys themselves identify circuit board structures which they serve to interlock.

Still another object of the present invention resides in the provision of an improved interlocking circuit comprising a plurality of keys so arranged that said keys may be easily removed or rearranged with respect to one another, thereby to permit ready alteration in a circuit being interlocked thereby.

A still further object of the present invention resides in the provision of an improved interlocked printed circuit arrangement which is foolproof in operation, assembly and interconnection, and which is inexpensive to manufacture, install and maintain.

In providing for the foregoing objects and advantages, the present invention contemplates the provision of an improved circuit structure comprising a mounting rack carrying one or more cards or circuit boards therein. Each card carries a unique printed or other electrical circuit thereon, and the actual circuit on a given board is identified and characterized by a predetermined arrangement of projections, apertures, notches or grooves formed, for instance, adjacent one edge of said card or board. The cards themselves are so arranged within the aforementioned mounting rack that the identifying notches or grooves thereof are disposed adjacent to one another, and the overall arrangement is in turn associated with a key or interlocking structure comprising a movable key bar having projections and/or depressions adapted to mate with the aforementioned notches or grooves in the several cards.

By this arrangement, therefore, once a key bar has been set up so that it is adapted to cooperate with a particular relative arrangement of projections, apertures, notches or grooves in a particular predetermined sequence of circuit cards or boards, the correctness of the overall circuit set-up can be readily checked by merely moving the key bar and its associated keys through the several notches or grooves in the aforementioned circuit cards or boards. This checking function, in accordance with a preferred embodiment of the present invention, also serves to control the application of power to the overall circuit; and in particular, the key bar may carry a switching mechanism thereon, such as a plunger actuated microswitch, whereby no power can be applied to the circuit arrangement until the several keys have successfully passed through the several notches in the aforementioned circuit cards or boards.

In accordance with a further feature of the present invention, the keys themselves may be removable from the aforementioned key bar whereby the several keys can be rearranged or removed and replaced by other keys, thereby to provide an interlocking system for any desired and predetermined arrangement of circuit boards. The keys are preferably coded in nature, whereby an examination of the keys themselves informs the observer of the circuit card to be associated therewith; and the said keys further are preferably so formed that once they have assumed a position where power is applied to the system, they lock the circuit cards in place thereby to prevent removal of the cards from a mounting rack or similar installation until power is removed.

The foregoing objects, advantages, construction and operation of the present invention will become more readily apparent from the following description and accompanying drawings, in which.

Figure 1:
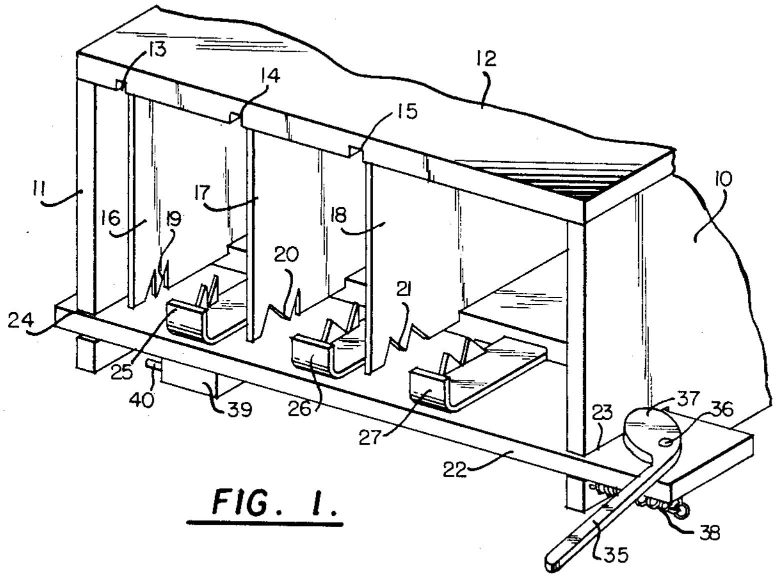
Figure 1 is a perspective view of a printed or other circuit board arrangement employing the improved interlocking system of the present invention.

Referring now to Figure 1, it will be seen that a printed or other circuit arrangement constructed in accordance with the present invention may comprise a mounting rack having, for instance, a pair of upright supports 10 and 11 interconnected by a structural member 12. The member 12 in turn includes a plurality of elongated grooves 13, 14, 15, etc., each of which is adapted to slidably receive a circuit board or card, such as 16, 17, 18, etc. It will be appreciated that the arrangement shown in Figure 1 is considerably simplified, and that as a matter of practice, e.g. in printed circuit arrangements of the types employed in computer applications, the mounting rack illustrated would carry a very large number of printed circuit cards closely spaced to one another whereby a relatively complex overall circuit could be disposed within a relatively confined space defined between the several members 10, 11 and 12.

The several circuit cards 16, 17, 18, etc. are mounted in parallel relation to one another, and each of the said cards carries, for instance, a printed circuit thereon (not shown), the nature of which circuit is identified by a characteristic notching or key-like configuration, such as 19, 20 and 21, formed along one edge of the card. In practice, the several printed circuits on the cards 16, 17, 18, etc. are interconnected to one another as well as to external sources of power or control potentials by appropriate connectors carried for instance by structure 12; but these connectors do not comprise per se, a portion of the present invention, and accordingly have not been illustrated.

The overall mounting rack further carries an elongated key bar 22 slidably disposed within grooves 23 and 24 formed respectively in upright members 10 and 11; and the said key bar 22 in turn supports a plurality of keys 25, 26 and 27. The particular arrangement of key bar and keys will be more readily appreciated by examination of Figure 3. In particular, it will be seen that key bar 22 includes a stepped portion 28 having a plurality of slots 29 therein, with each of said slots being adapted to receive the elongated portions 30 of the several keys 25, 26, 27, etc. Each of the slots 29 preferably includes spring or detent means (not shown), or similar arrangements such as appropriate locknuts for maintaining a particular key in place once said key has been inserted therein. This particular arrangement further permits the several keys to be removed from their associated key bar whereby the said keys may be interchanged or relocated, thereby to set up a key bar for use in interlocking a particular configuration of parallel mounted circuit cards or boards.

Each of the keys 25, 26, 27, etc. includes a plurality of projections 31, 32, 33, etc. which are of a configuration complementary to the notches 19, 20, 21, etc. in the several circuit boards 16, 17, 18, etc. Each of the several keys 25, 26, 27, etc. further includes an upstanding end structure 34 which is adapted to overlie and lock a circuit card in place under proper operating conditions, as will be described.

Returning now to the arrangement of Figure 1, it will be seen that key bar 22 also carries a control or actuating lever 35 pivotally supported at 36 on key bar 22, and having a cam surface 37 at one end thereof. Key bar 22 is also connected to one of the upright members, such as 10, by a spring member 38, arranged as shown, this spring member being normally adapted to urge the key bar toward the left. In addition, key bar 22 preferably carries a switch 39 having a suitable actuating member such as plunger 40; and the said switch 39—40 is preferably interconnected to the aforementioned electrical connector elements in member 12, whereby the presence or absence of power or other signals at these connector members is determined by the open or closed state of switch 39—40.

Figure 1 particularly illustrates the configuration of the improved interlocking system under de-energized conditions of operation. Under these conditions, lever 35 is so disposed that cam surface 37 bears upon upright member 10, thereby holding key bar 22 in a righthand position against the resilient force of spring 38. In this particular position, the several end structures 34 of keys 25, 26 and 27 are displaced to the right of the several slots or notches 13, 14, 15, etc. in structure 12, whereby cards can be readily inserted into or removed from these slots 13, 14, 15, etc., thereby physically to set up the overall circuit structure. Moreover, under this condition of operation, the plunger 40 of switch member 39 is free of upright 11 whereby switch 39 is in an open condition and no power is applied to any of the connectors in structure 12. Under the condition of operation illustrated in Figure 1, therefore, the overall circuit is de-energized and appropriate circuit cards having notched edges conforming to the several keys 25, 26, 27, etc. can be inserted into slots 13, 14, 15, etc.

Figure 2:
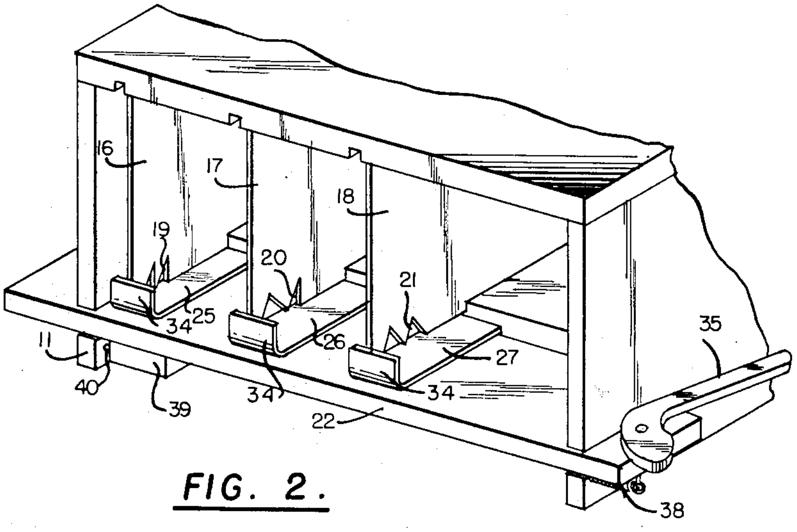
Figure 2 is a perspective view of the system shown in Figure 1 illustrating the operation of the interlock feature.

After the circuit has thus been prepared for energization, lever 35 can be moved to the position illustrated in Figure 2 whereupon spring 38 urges key bar 22 toward the left-hand position illustrated in Figure 2. If the several boards 16, 17, 18, etc. are properly disposed in the mounting rack, in accordance with the relative positions of the several keys 25, 26, 27, etc., these keys will readily pass through the said notches, such as 19, 20, 21, etc., thereby permitting plunger 40 of switch 39 to abut against a portion of upright 11 whereby power is applied to the system. If, however, one or more of the cards should be disposed at an incorrect location in the mounting rack, or if an incorrect card should somehow be placed within the mounting rack, the key associated with that card will not be able to pass through the notches on the edge of said card, and switch 39 will not be closed. This arrangement, therefore, assures that power is applied to the system only when the several cards are properly arranged in the mounting rack in accordance with the predetermined arrangement of movable keys in that rack.

It should further be noted that when the key bar 22 is moved to the lefthand position, illustrated in Figure 2, indicating that the several cards or circuit boards are correctly disposed whereby power is applied to those boards, the upright portions 34 of the several keys 25, 26, 27, etc. are caused to overlie the front or vertical edges of the circuit boards. This consideration therefore prevents the removal of any of the circuit boards from the system so long as power is applied thereto; and before such circuit board removal or replacement can be effected, key bar 22 must once more be moved to its righthand position thereby de-energizing the overall circuit.

Figures 3, 4, 5A, 5B:
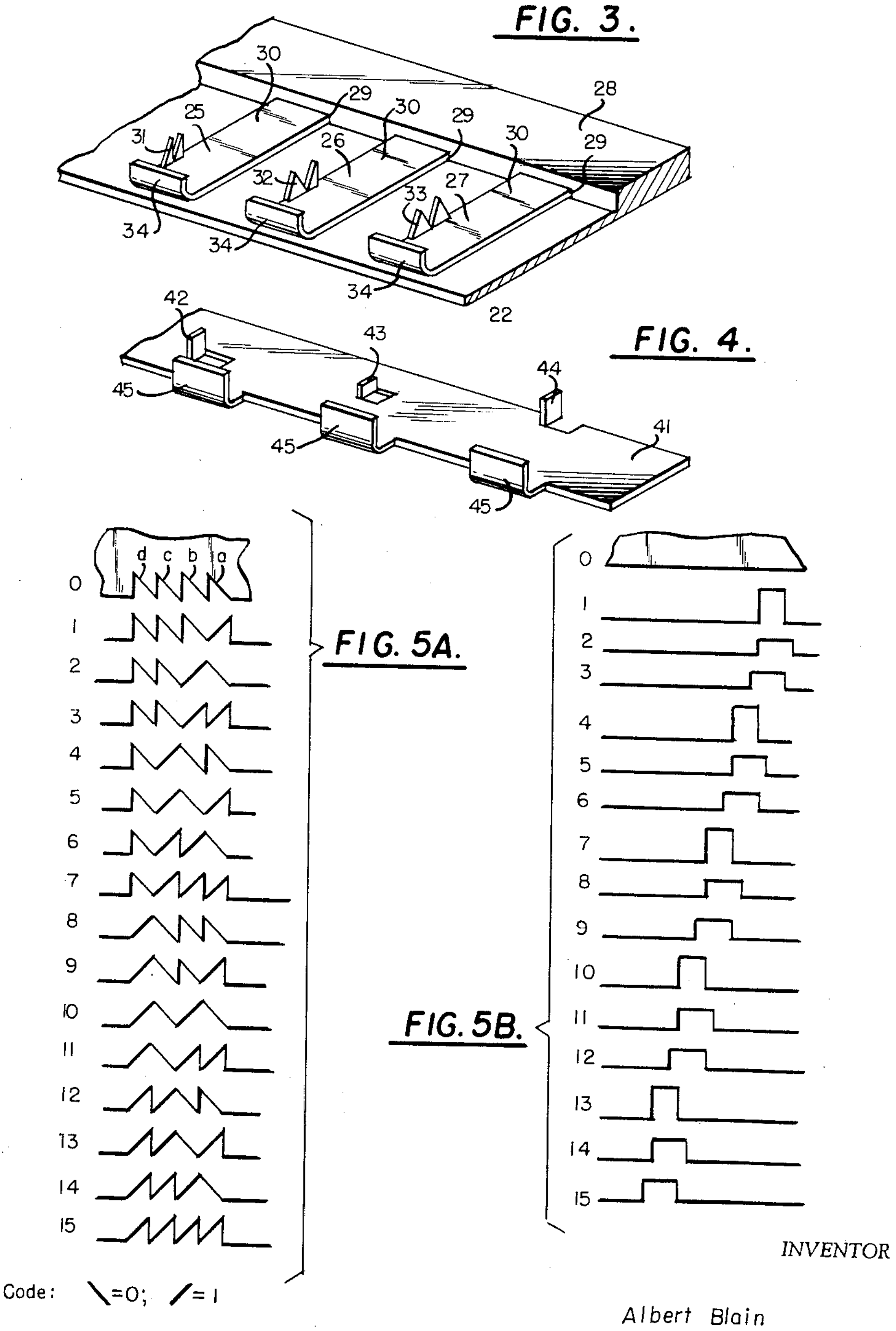
Figure 3 is a perspective view of one form of keying arrangement which may be employed in accordance with the present invention.
Figure 4 is a perspective view of another form of keying arrangement which may be employed in accordance with the present invention.
Figures 5A and 5B illustrate possible codes which may be employed in the interlock systems of the present invention.

The particular arrangement of keys and key bars described in reference to Figures 1 through 3 represents only one form which the keying or interlocking arrangement of the present invention may take. Various other arrangements will be suggested to those skilled in the art, it being understood that the present invention broadly contemplates the provision of a unique arrangement of keys and notches, or keys and other apertures so disposed with respect to one another that appropriate relative movement between the said keys and notches or apertures indicates whether or not plural portions of an overall circuit arrangement are correctly disposed relative to one another.

One such other form of key bar is illustrated in Figure 4; and this particular form of the invention is in fact illustrative of a keying arrangement which is permanent in nature, as distinguished from the removable and replaceable keys comprising the embodiment already described in reference to Figure 3. Thus, referring to Figure 4, it will be seen that in accordance with this further embodiment of the present invention, a key bar 41 may be provided having a plurality of key projections 42, 43, 44, etc. punched and bent therefrom. The several projections 42, 43, 44, etc. may assume varying heights and locations relative to one another whereby the overall key bar 41 is adapted to cooperate with a unique set of circuit boards or cards having notched edges complementary to the aforementioned projections 42, 43, 44, etc. Key bar 41 further preferably includes a plurality of upright projections 45 disposed transverse to the projections 42, 43, 44, etc., and so located with respect to the said key projections that they perform the function of upright projections 34 already described, i.e., projections 45 prevent removal of a circuit card or board from the mounting rack so long as the key bar assumes such a process that power is applied to the overall system.

Various key configurations and coding arrangements can be employed in accordance with the present invention. It is preferable, however, to adopt a code which can be readily recognized by examination of the keys themselves, whereby an overall printed circuit structure can be set up quickly and without the necessity of referring to a master table. Two possible such codes are illustrated in Figures 5A and 5B; and each of these codes is characterized by a binary or other easily recognizable coded relationship between the several keys. Figure 5A illustrates a code employing plural projections (similar to Figures 1–3) while Figure 5B illustrates such a code utilizing single projections (similar to Figure 4).

Thus, referring to Figure 5A, it will be seen that a unique key may be fabricated, e.g. for each of the decimal numbers zero through fifteen, by utilizing four key surfaces *a*, *b*, *c*, and *d*, so slanted within unique locations on the key as to identify and indicate, by a binary number, the actual character of that key. The code employed assumes that when any one of the surfaces *a*, *b*, *c*, *d*, is slanted upward to the left, the binary digit represented by that surface is zero, while a slant of the surface upward to the right represents a binary digit of one. Examination of Figure 5A reveals that this coding arrangement permits any binary number corresponding to decimal numbers zero through fifteen to be formed through the use of four slanted surfaces only. It will be appreciated, of course, that the code of Figure 5A can be readily expanded, e.g. the addition of a fifth slanted surface will permit any binary digital number between zero and thirty-one to be represented without appreciably increasing the dimensions of the key.

An alternative arrangement, employing only a single notch or key projection is illustrated in Figure 5B. In this particular arrangement, the numbers 1, 4, 7, 10 and 13 are represented by a key projection or notch of predetermined height at a predetermined location. The intermediate numbers are represented by keys or notches of lesser height and of greater widths in opposite directions, respectively. Again, the particular code will be appreciated by examination of Figure 5B.

Notwithstanding the difference in the codes shown in Figures 5A and 5B, however, the basic consideration previously discussed applies. That is, the key associated with a given number will pass only through a notch associated with that number and could not possibly pass through the notches associated with any other number. Each of these code arrangements furthermore permits ready identification of the particular key and circuit associated therewith, through mere examination of the key itself.

While there has thus been described a preferred embodiment of the present invention, many variations will be suggested to those skilled in the art, and certain of these variations have already been described. Other variations will be apparent. For instance, while the movable key structures described have comprised projections for the most part, while the stationary key structures of the several circuit boards have comprised depressions for the most part, these types of key structures could be interchanged with one another. Moreover, while the keys and circuit board have been so arranged that selective mating of the keys occurs adjacent the edges of the board, the apertures could, by appropriate arrangement of the several parts, be disposed internally of the board. In addition, it will be appreciated that switch 39—40, for instance, may be mounted on the mounting rack itself and can be actuated by an appropriate structure carried by the movable key bar rather than the reverse situation shown and described in the figures.

Still further variations will be suggested; and it must therefore be understood that the foregoing description is meant to be illustrative only and should not be considered limitative of the invention. All such variations as are in accord with the principles described are meant to fall within the scope of the appended claims.

Having thus described the invention, what is claimed is:

1. In combination, a plurality of printed circuit boards disposed in substantially parallel relation to one another, each of said boards having an irregular edge portion which is uniquely characteristic of the circuit on said board, a key bar which is movable relative to said plurality of circuit boards, said key bar having a plurality of spaced key projections complementary respectively to the irregular edge portions of said boards, and means for moving said key bar in a direction transverse to the planes of said circuit boards thereby to simultaneously pass said key projections through the irregular edges of all said boards.

2. The structure of claim 1 including switch means interconnecting said circuit boards to an electrical source, and means responsive to predetermined movement of said key bar for controlling the actuation of said switch means.

3. The combination of claim 1 wherein said spaced key projections are disposed, respectively, on individual key structures, said key structures being removably mounted on said key bar.

4. The combination of claim 3 wherein each of said key structures includes an upstanding locking surface located to overlie an edge of one of said circuit boards when said key projections pass through the irregular edges of said boards, said upstanding surfaces being disposed transverse to said key projections thereby to maintain said circuit boards in a certain predetermined position.

5. In combination, a plurality of normally de-energized electrical circuits respectively mounted on a plurality of supporting structures disposed adjacent one another, each of said supporting structures including a first key structure uniquely characteristic of the circuit thereon, a plurality of second key structures respectively adjacent to and spaced from said supporting structures, means for selectively effecting relative movement between said first and second key structures whereby each of said second key structures mates with one of said first key structures provided said circuit supporting structures are correctly disposed relative to one another, and means responsive to simultaneous mating of said pluralities of first and second key structures for simultaneously electrically energizing all of said circuits.

6. The combination of claim 5 including means operatively connected to said relative movement means for locking said supporting structures in place relative to one another when said first and second key structures mate with one another.

7. The combination of claim 5 wherein said supporting structures comprise planar members mounted in parallel relation to one another in a mounting rack, said second key structures being spaced from one another along an elongated key bar, said key bar being slidably mounted in said rack in a direction transverse to the planes of said supporting structures.

8. In combination, a mounting rack having a plurality of guide slots therein, a plurality of electrical circuit structures mounted on boards removably disposed in said guide slots respectively, each of said boards having a coded aperture configuration thereon representative of the electrical circuit on said board, a plurality of keys interconnected with one another, each of said keys being normally disposed adjacent one of said coded aperture configurations respectively, and means for selectively moving said interconnected keys through the coded aperture configurations on said boards from one side of each said board toward the other side of said board thereby to simultaneously check the relative positions of said keys with the relative positions of said boards.

9. The combination of claim 8 wherein said plurality of keys are mounted on a common key bar, and means on said key bar for locking said circuit boards in said guide slots when said keys pass through said coded aperture configurations.

10. The combination of claim 9 wherein said locking means includes a plurality of upstanding projections on said key bar respectively disposed adjacent said plurality of keys.

11. The combination of claim 9 wherein said keys are removably mounted on said key bar.

12. The combination of claim 8 wherein each of said keys has a predetermined number of slanted key edges, the relative slant directions of said key edges being uniquely determinative of a given key.

13. The combination of claim 8 wherein each of said keys comprises a single projection, the position and size of said key projection being uniquely determinative of a given key.

14. In combination, a mounting rack for circuit boards including an elongated key bar slidably disposed thereon, said key bar including a plurality of key projections spaced from one another along the direction of elongation of said key bar, each of said key projections being located adjacent to a unique portion of said rack adapted to receiver and position a single circuit board, and means for selectively moving said key bar between first and second key bar positions relative to said mounting rack thereby to move each of said key projections through its associated board position.

15. The combination of claim 14 including a plurality of printed circuit boards on said mounting rack, and switch means responsive to movement of said key bar to a selected one of said first and second positions for energizing all of said printed circuit boards.

16. The combination of claim 15 wherein said switch means is carried by said key bar, and a fixed structure mounted adjacent the path of movement of said key bar for selectively engaging and closing said switch means.

17. In combination, a plurality of printed circuit boards disposed in side-by-side substantially parallel relation to one another, each of said boards having a first key structure thereon uniquely characteristic of the circuit on said board, a plurality of second key structures spaced from one another in accordance with a desired spacing between said circuit boards, the configuration of each of said second key structures being uniquely complementary to a preselected one of said first key structures whereby the relative spacing and configurations of said second key structures correspond to a desired spacing and relative disposition of said plurality of circuit boards, and means for simultaneously moving all of said second key structures relative to all of said first key structures whereby simultaneous mating of all said first and second key structures during said relative movement serves to check the disposition of said circuit boards relative to one another.

18. In combination, a plurality of printed circuit boards disposed in spaced relation to one another, each of said boards having an irregular edge configuration, an elongated key bar extending transverse to said printed circuit boards adjacent one edge of each said board, said key bar having a plurality of spaced key projections complementary respectively to the irregular edges of said boards, each of said key projections being disposed to one side of one of said boards adjacent the irregular edge configuration of said board, operator means for moving said key bar and all of said key projections thereby to pass each of said key projections from said one side of its associated board, through the irregular edge of said board, toward the other side of said board whereby said key bar is adapted to move from a predetermined first position to a predetermined second position only when all said key projections pass entirely into the irregular edge configurations of all said boards, and spring means coupled to said key bar for normally urging said key bar toward one of said first and second positions.

19. In combination, a plurality of electrical circuits respectively disposed on a plurality of substantially flat board structures disposed adjacent one another, each of said board structures including a first key structure, a plurality of second key structures mechanically interconnected to one another and positioned respectively adjacent to and spaced from said board structures, means for selectively effecting relative movement between said first and second key structures whereby each of said second key structures mates with one of said first key structures provided said circuit board structures are correctly disposed relative to one another, and means responsive to simultaneous mating of said pluralities of first and second key structures for electrically energizing said circuits.

20. In combination, a mounting rack having a plurality of normally de-energized printed circuit boards removably positioned therein, said rack including an elongated key bar movable thereon and normally disposed at a first position relative to said rack and boards, means for selectively moving said key bar from said first position to a second position relative to said mounting rack and boards whereby said key bar simultaneously locks all said printed circuit boards in position in said rack when said key bar is in said second position, and means responsive to movement of said key bar into said second position for permitting energization of said normally de-energized circuit boards.

21. In combination, a plurality of normally de-energized printed circuit boards disposed in spaced relation to one another, said circuit boards being normally movable in position relative to one another, a plurality of different key structures mechanically connected to one another, said key structures being spaced from one another and being respectively located adjacent said plurality of printed circuit boards, means for simultaneously locking all of said interconnected key structures to all of said circuit boards thereby to lock said circuit boards into fixed positions, and electrical switch means responsive to the locking of all said circuit boards into said fixed positions for energizing all said circuit boards.

22. The combination of claim 21, wherein said means for locking said circuit boards into fixed positions includes separate means on each of said boards for receiving an associated one of said key structures.

23. The combination as called for in claim 18 wherein said key projections are arranged in a coded pattern.

24. The combination of claim 18 wherein said key projections are arranged in a predetermined code to mate with the irregular edges of said circuit boards to thereby identify the circuit board in a certain location.

25. The combination described in claim 5 in which each of said second key structures comprises at least one projection, said projection having a coded significance to identify said electrical circuits on said supporting structures so that said circuit supporting structures are properly mounted prior to the energizing of said circuits.

26. An electrical circuit board interlock system comprising, in combination, a mounting rack having a plurality of printed circuit boards removably positioned thereon, said rack including a key bar movable thereon, said bar having a plurality of first interlocking means of different shapes, each of said boards including second interlocking means of complementary shape to one of said plurality of first interlocking means, means for moving said key bar from one position to a further position relative to said rack and said boards with said interlocking means simultaneously engaging and locking said boards into position on said rack.

References Cited in the file of this patent

UNITED STATES PATENTS

| | | |
|---|---|---|
| 2,077,160 | Wilson | Apr. 13, 1937 |
| 2,281,958 | Snavely | May 5, 1942 |
| 2,579,168 | Ballon | Dec. 18, 1951 |
| 2,731,609 | Sobell | Jan. 17, 1956 |
| 2,832,013 | Pedersen et al. | Apr. 22, 1958 |

UNITED STATES PATENT OFFICE

CERTIFICATE OF CORRECTION

Patent No. 2,958,014 October 25, 1960

Albert Blain

It is hereby certified that error appears in the printed specification of the above numbered patent requiring correction and that the said Letters Patent should read as corrected below.

Column 5, line 16, for "process" read -- position --; column 7, lines 38 and 39, for "receiver" read -- receive --.

Signed and sealed this 25th day of April 1961.

(SEAL)

Attest:

ERNEST W. SWIDER

Attesting Officer

DAVID L. LADD

Commissioner of Patents